United States Patent [19]

Kubo et al.

[11] Patent Number: 5,120,393
[45] Date of Patent: Jun. 9, 1992

[54] METHOD FOR MOLECULAR-BEAM EPITAXIAL GROWTH

[75] Inventors: Minoru Kubo, Katano; Tadashi Narusawa, Hirakata, both of Japan

[73] Assignee: Matsushita Electric Industrial Co., Ltd., Osaka, Japan

[21] Appl. No.: 639,788

[22] Filed: Jan. 10, 1991

[30] Foreign Application Priority Data

Jan. 12, 1990 [JP] Japan ................. 2-4851

[51] Int. Cl.$^5$ ............................................. C30B 25/16
[52] U.S. Cl. ..................... 156/601; 156/610; 156/611; 156/612; 156/614; 148/DIG. 6; 148/DIG. 46; 148/DIG. 48; 148/DIG. 169; 437/81; 437/105; 437/107; 437/930; 437/935; 437/936; 437/987
[58] Field of Search ............ 148/DIG. 6, 25, 45, 148/DIG. 46, DIG. 48, 41, 56, 65, DIG. 169; 156/610–614, 601; 427/35, 38, 248.1, 255.1; 437/18, 81, 105–107, 170–172, 930, 935, 936, 987

[56] References Cited

U.S. PATENT DOCUMENTS

| | | | |
|---|---|---|---|
| 4,071,383 | 1/1978 | Nagata et al. | 437/107 |
| 4,086,108 | 4/1978 | Gonda | 437/107 |
| 4,226,648 | 10/1980 | Goodwin et al. | 437/20 |
| 4,385,946 | 5/1983 | Finegan et al. | 437/25 |
| 4,550,031 | 10/1985 | Abrokwah | 427/38 |
| 4,800,100 | 1/1989 | Herbots et al. | 437/250 |
| 4,847,216 | 7/1989 | d'Avitaya et al. | 437/105 |
| 4,855,013 | 8/1989 | Ohta et al. | 156/610 |
| 4,983,540 | 1/1991 | Yamaguchi et al. | 437/25 |

FOREIGN PATENT DOCUMENTS

| | | | |
|---|---|---|---|
| 0032414 | 2/1986 | Japan | 437/107 |
| 0014419 | 1/1988 | Japan | 437/107 |
| 2144151 | 2/1985 | United Kingdom | 437/107 |
| 8700966 | 2/1987 | World Int. Prop. O. | 118/720 |

OTHER PUBLICATIONS

Farrow, "The Use of Ion Beams in Molecular Beam Epitaxy", Thin Solid Films, 80 (1981), pp. 197–211.
Parker, *The Technology and Physics of Molecular Beam Epitaxy*, Plenum Press, New York, 1985, pp. 40–41.

Primary Examiner—Robert Kunemund
Attorney, Agent, or Firm—Ratner & Prestia

[57] ABSTRACT

Flatness of atomic-accuracy is achieved in an MBE epitaxial growth process by imparting kinetic energy to atoms absorbed on a substrate by means of irradiation by ion-beam for surface bombardment. Ion-beam surface bombardment may also be used for evaluation. The molecular-beam for epitaxial growth and the ion bombardment for surface energization and surface evaluation may all be operated in a pulse mode and synchronized so that evaluation and growth are conducted alternately while growth and energization are conducted simultaneously.

2 Claims, 7 Drawing Sheets 5,120,393

METHOD FOR MOLECULAR-BEAM EPITAXIAL GROWTH

BACKGROUND OF THE INVENTION

This invention relates to a molecular-beam epitaxial growth method in which growth of an atomic layer is exactly controlled, and particularly to an epitaxial growth method, utilizing ion-bombardment to enhance and evaluate epitaxial growth of a compound semiconductor.

PRIOR ART

In one conventional epitaxial growth method, as illustrated in FIGS. 8 and 9, a molecular-beam epitaxy (hereinafter "MBE") apparatus includes a reflected high-energy electron diffraction (hereinafter "RHEED") function. This is shown in FIG. 8.

As shown in FIG. 8, elemental materials 4 are supplied by molecular-beams 3 produced by one or more Knudsen-cells ("K-cells") are deposited on a substrate 5 placed in a vacuum chamber 1 kept at ultra-high vacuum (abbreviated as "UHV"). Taking as an example, a GaAs/AlGaAs compound semiconductor, the elements galium arsenic and aluminum are supplied by the elements molecular beams 3 produced by corresponding K-cells and alternately deposited on substrate 5 kept at a temperature in the range from 300° to 700° C. Epitaxial growth of the deposited elements takes place thereon, and this growth process is observed and evaluated by RHEED (J. J. Harris and B. A. Joyce, Surface Science, 103, (1981) L90.

In using RHEED, high-energy electrons having an energy of 10 to 40 kV produced by an electron-beam source 7 are incident on crystal growth substrate 5. Incident electrons 8 are then scattered in a manner dependent on the condition of the surface of substrate 5. Thus, when those scattered electrons 9 are guided to a screen 10 coated with fluorescent material, an electron diffraction pattern carrying information about the surface of substrate 5 can be observed on the screen. Since this electron diffraction pattern is highly sensitive to the surface roughness of substrate 5, a simple examination of only typical spots in that diffraction pattern is enough to tell the exact surface condition.

FIG. 9 shows how changes of typical RHEED spot intensities in an electron diffraction pattern are produced by growth on a surface. FIG. (9a) is a graph showing a time-dependent change of RHEED spot intensity, and FIGS. 9(b), (c), and (d) are schematic illustrations showing the surface condition of substrate 5 at time points (b), (c), and (d) in FIG. 9(a). 5(a) indicates an epitaxially grown layer.

As shown, the RHEED spot intensity oscillates as crystal growth proceeds, and the period of oscillation corresponds to time required to grow one to two epitaxial layers on the substrate. That occurs because a maximum intensity is observed when the surface is flat; changes in spot intensity produced by the electron beam reflected from the crystal surface is observed in the form of an oscillation since a flat surface condition is periodically produced as the growth of a single atomic layer is repeated one after another.

By employing MBE together with RHEED, it is possible to control the growth of crystal while observing its growth condition. With MBE employed in this method, monitoring of the flatness of surface is possible, but the positive control of the flatness is impossible.

On the other hand, when the objective is to attain flatness at an exactness of a single atomic layer, acceleration of diffusion of atoms adsorbed on the substrate surface, produced by externally supplied extra energy to rearrange these atoms evenly on the surface, has been conventionally practiced.

As a conventional method to supply external energy, heating the substrate has been commonly employed. However, for this purpose, laser-light irradiation or a repeated crystal growth method, MEE (Migration Enhanced Epitaxy); Y. Korikoshi et al., Japan Journal of Applied Physics 25 (1988) 2868, wherein an adequate diffusion time is allowed for rearranging atoms between pulsively irradiated molecular beams by which atoms are supplied, have been employed as well.

According to conventional methods to give extra energy to surface atoms, as mentioned above, methods such as heating of the substrate or laser-light irradiation have been popularly employed in order to accelerate the diffusion of atoms adsorbed on the substrate surface regardless of the type of substrate.

When the substrate is heated, irrespective of whether the direct or indirect method is used, the substrate temperature is brought up to a certain level so that damage caused by heating, including damage of substrate, contamination caused by impurities produced by heating, and deterioration of equipments, etc., are inevitable. Since some compound semiconductors are highly sensitive to heat application, heating these types of compounds has to be avoided.

On the other hand, laser-light irradiation could be an indirect method. However, even in this case, no kinetic energy and no momentum is given directly to the atoms adsorbed on the surface. Rather, light irradiation is an indirect method to supply energy for surface diffusion of atoms through internal excitation of atoms or molecules supplied by molecular beams.

These processes have certain inherent problems such as intake of impurity atoms produced by ionization of undesirable elements and generation of crystal defects. Moreover, with light irradiation, no directionality of kinetic energy can be given to the adsorbed atoms.

SUMMARY OF THE INVENTION

This invention provides a new molecular beam epitaxial growth method by which directional kinetic energy is imparted to atoms adsorbed on a substrate so that flatness is attained with dimensional exactness of a mono-atomic layer, during epitaxial growth. This is done without causing crystal damage, impurity contamination, intake of impurity atoms, generation of crystal defects, and other undesirable phenomena.

In this new molecular-beam epitaxial growth process, directional kinetic energy (produced by ion-beam bombardment on the substrate), is imparted to atoms adsorbed on the substrate. These atoms thus are endowed with a higher diffusion coefficient on the substrate during the epitaxial growth of said atoms.

Moreover, in this new ion-bombardment molecular-beam epitaxial growth process, epitaxial growth is conducted with simultaneous ion-beam irradiation for surface structure analysis and for surface atom bombardment to give surface atoms high kinetic energy or higher diffusivity. This ion beam for surface atom energization employs ions identical or similar to ions employed for surface structure analysis, so that the types of surface atoms and the surface structure can be measured at an exactness of a mono-atomic layer during its epitaxial growth.

Furthermore, with this new ion-bombardment molecular-beam epitaxial growth, the molecule beam deposition or the surface bombardment ion-beam and the surface structure evaluation ion beam are alternately irradiated on the substrate, so that a determination (of the type of atoms existing on the substrate and the surface structure at an exactness of a mono-atomic layer), is made alternately with the epitaxial growth of atoms with diffusion coefficient heightened by kinetic energy imparted to atoms adsorbed on the surface of substrate.

According to the operating principle of this invention, epitaxial growth, controlled by an exactness of a single atomic layer, becomes possible because the epitaxial growth is formed by atoms of which diffusion on the substrate surface is accelerated by the energy given to the atoms adsorbed on the substrate surface by the irradiation of ion-beams for surface bombardment. This bombardment may be either simultaneously with or may alternate with crystal growth.

Furthermore, it is also possible to conduct epitaxial growth and growth evaluation simultaneously or alternately by irradiating the surface with surface bombardment ion-beam and surface structure evaluation ion beam either simultaneously or alternately. In this way, epitaxial growth can be more precisely controlled.

In evaluating the surface structure by means of ion bombardment, an energy distribution of scattered ions is measured so that the type of atom and the surface structure can be exactly determined. Moreover, by setting the incident surface bombardment ion-beams at any desired angle, a desired directionality can be given to the surface diffusion of atoms existing on the surface. This ion-beam function is in addition to the possibility of observing the detailed arrangement of atoms on the surface.

By employing the ion-bombardment molecular-beam epitaxial growth method of this invention, epitaxial growth controlled by an exactness of a mono-atomic layer can be accomplished because the epitaxial growth is formed by atoms of which diffusion on the substrate surface is accelerated by energy imparted to the atoms adsorbed on the substrate surface by surface bombardment during crystal growth. Neither thermal nor light energies are utilized to attain flatness of surface in this process.

Therefore, by imparting kinetic energy to atoms adsorbed on the surface, epitaxial growth controlled at an exactness of a mono-atomic layer can be accomplished without causing problems such as damage of substrate, contamination by impurities, deterioration of equipments, intake of impurity atoms, and generation of defects.

Furthermore, by employing the ion bombardment molecular-beam epitaxial growth method of this invention, in which an ion-beam for surface bombardment and an ion-beam for surface structure evaluation are used simultaneously or alternatively, it is possible to obtain a substantially improved controllability of epitaxial growth by conducting crystal growth and evaluation simultaneously or alternatively.

In surface structure evaluation by means of ion bombardment, it is possible to evaluate the type of collided atom and to determine the surface structure by conducting an energy analysis of scattered ions, and it is also possible to give a directionality to the surface diffusion of atoms existing on the surface by setting the incident ion-beam at a desired angle. Moreover, it is possible to observe the detailed structure of atoms arranged on the surface by measuring the angle dependency of scattered ions.

DETAILED DESCRIPTION OF THE INVENTION

One of the embodiments of the invention is now explained below by referring to the attached drawings.

Figure 1:
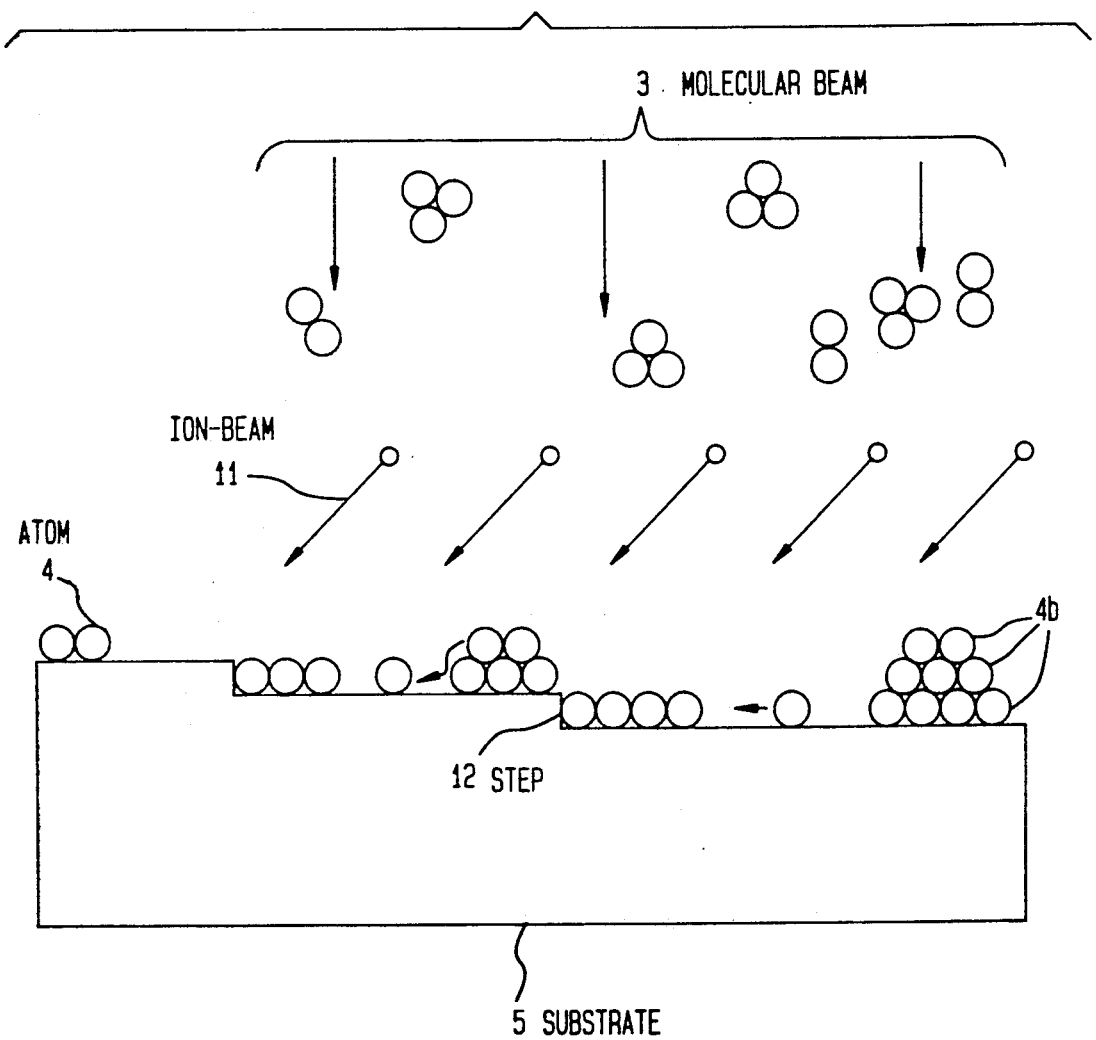
FIGS. 1, 2, 3, and 4a to c show the principles of the molecular-beam epitaxial growth method of this invention.

A reaction process which takes place on the substrate during molecular-beam epitaxial growth using ion-bombardment is shown in FIG. 1, wherein the atoms 4 supplied by molecular beam 3 arrive at the surface of substrate 5, and these atoms diffuse on the surface 5 within a range determined by the kinetic energy of atoms 4.

In a case when inadequate energy is given to these atoms, atoms 4 are unable to settle down at proper sites on the surface of substrate 5, and stop instead at improper sites causing crystal lattice defects. When an ion-beam 11 for surface bombardment is irradiated during epitaxial growth made by molecular-beam 3 irradiation, or when these irradiations are alternatively conducted, those ions for surface bombardment collide with atoms 4 adsorbed on the surface of substrate 5. Then, surface diffusion of atoms 4 is accelerated by as these atoms acquire additional kinetic energy.

Figure 2:
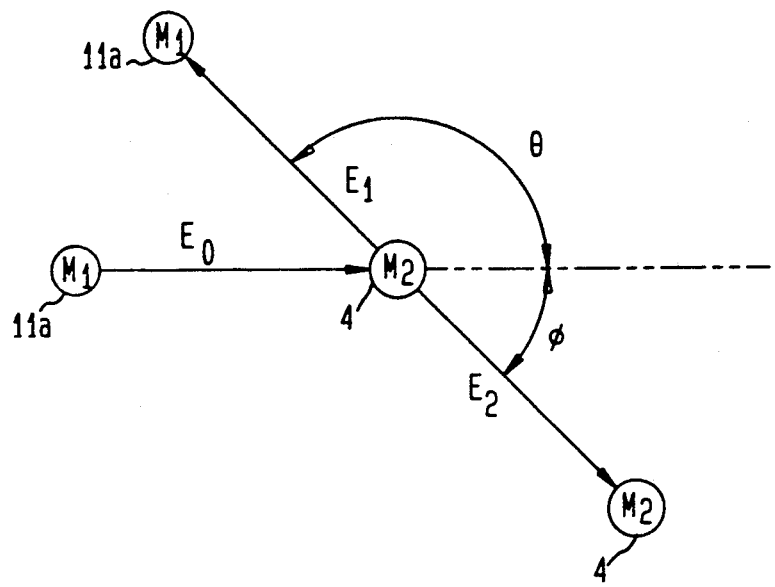

This kinetic energy exchange process can be shown by the process illustrated in FIG. 2. The kinetic energy of scattered ions (ions for surface atom-bombardment) and target atoms are expressed by FIGS. 1 and 2 respectively.

When an incident ion 11a (from beam 11) (ion for surface atom bombardment) having a mass of $M_1$ and energy of $E_0$ collides with a target atom 4 having a mass of $M_2$, the scattered ion 11a having a mass of $M_1$ would have a kinetic energy of $E_1$ and the target ion 4 of mass $M_2$ would have a kinetic energy of $E_2$. $\theta$ and $\phi$ are the angle of the scattered ion and an angle showing the moving direction of target ion 4, with reference to the angle of incident ion.

$$E_1 = E_0 \left( \frac{(M_2^2 - M_1^2 \sin^2\theta)^{\frac{1}{2}} + M_1 \cos\theta}{M_2 + M_1} \right)^2 \quad (1)$$

where $M_2 > M_1$ $$E_2 = E_0 - E_1 \quad (2)$$
$$= E_0 \cdot \frac{4M_1 \cdot M_2}{(M_2 + M_1)^2} \cos^2\phi$$

where $\phi < \pi/2$

If the kinetic energy $E_2$ is excessive, atom 4 will leave or evaporate from the surface of substrate 5, and no epitaxial growth is possible. Moreover, sputtering or knock-on may take place upon irradiation of ion-beams for surface bombardment, and as a result of this, surface damage may occur. These phenomena may take place to an extent determined by the type, mass, and energy of ions and the type of substrate.

In this invention, these damages are restricted within a permissible range by employing either hydrogen or helium ions (having a relatively small mass) for surface bombardment, and by employing an acceleration energy of less than 1 KeV which produces a penetration depth of bombarding ions of about several atomic layers.

When the ion-beam II for surface atom bombardment is employed under this condition, it is possible to give a uniform directionality to the surface atoms 4 by setting the ion beam at a proper incident angle against the surface of substrate 5.

In FIG. 1, a step 12 consisting of a single atomic layer is formed at the left side on the surface. The step 12 may be formed depending on the surface orientation and the surface condition, and this can act as a nucleus from which crystal growth may take place. Therefore, atoms 4 tend to come to step 12 and are arranged to constitute a flat crystal plane, accomplishing epitaxial growth.

However, those atoms having inadequate kinetic energy may coagulate in a form of island (see atoms 4b in FIG. 1, for example). Ion-bombardment imparts those atoms enough kinetic energy to restart surface diffusion, and this can be efficiently performed by diffusing atoms 4 toward step 12 in FIG. 1. Therefore, it is desirable, in this case, to direct the incident ion angle (ions for surface bombardment) from the right side of the drawing, as shown by the orientation of ion beams 11.

In the present form of bombardment equipment, the incident angle of the ion bombardment beam can be set at any desired angle, and by doing this, epitaxial growth with utmost surface flatness can be accomplished highly efficiently. Moreover, as mentioned before, selective crystal growth can be accomplished by forming a desired fine structure (such as step 12) on the substrate 5 first and by applying ion bombardment at a desired incident angle thereafter.

In such a crystal growth process using ion-bombardment, particularly in a case where exact control of atomic layer growth has to be carried out during epitaxial growth of a compound semiconductor, atoms 4 are supplied by a molecular-beam which is precisely pulse controlled.

Figure 3:
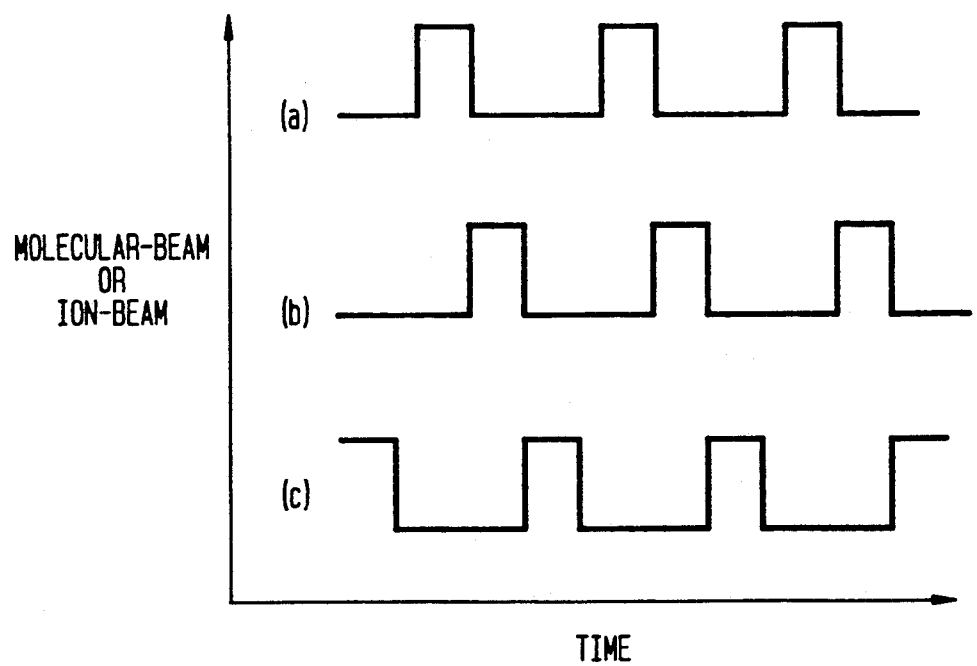

FIG. 3 shows a timing chart which illustrates the control of the atom supply molecular-beam 3, ion beam 13 for surface bombardment, and ion-beam 14 for surface structure evaluation, wherein (a) is a molecular beam pulse, (b) is an ion-beam pulse for surface bombardment, and (c) is n ion-beam pulse for surface structure evaluation.

Figure 4A:
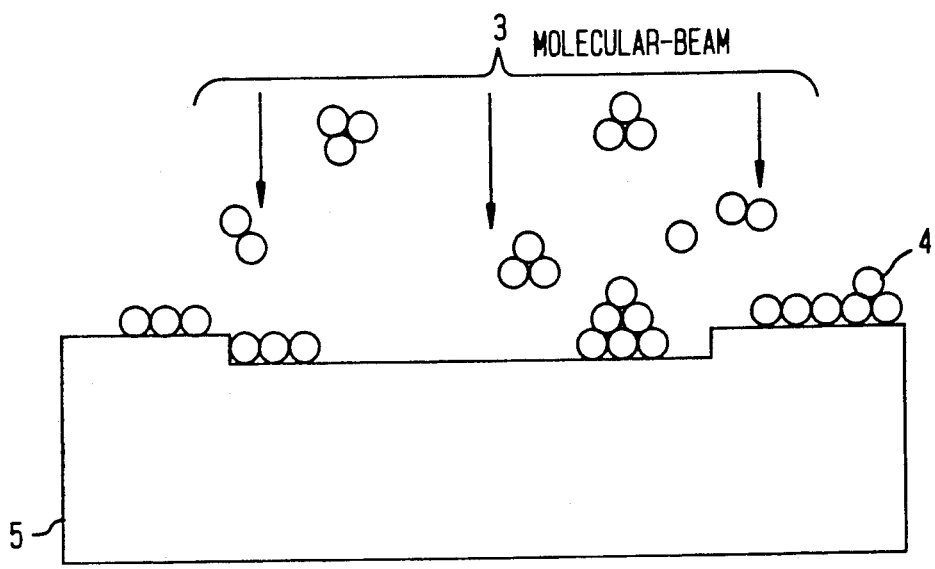
Figure 4B:
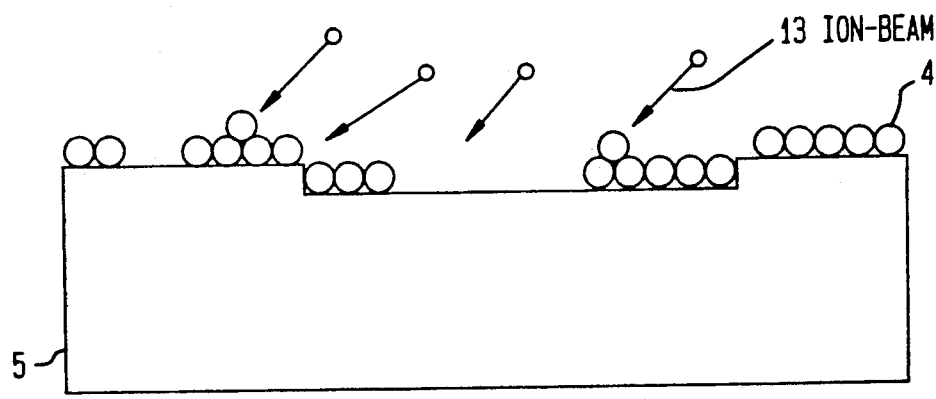

FIG. 4 shows the schematic states of the surface of a substrate corresponding to that shown in FIG. 3. Specifically, FIG. 4(a) shows a state at which the molecular-beam 3 is irradiated, FIG. 4(b) shows a state at which the ion-beam 13 for surface bombardment is irradiated, and FIG. 4 (c) shows a state at which the ion-beam 14 for surface structure evaluation is irradiated.

In these cases, the molecular-beam pulse shown in FIG. 3(a), the ion-beam pulse for surface bombardment shown in FIG. 3(b), and the ion-beam pulse for surface structure evaluation shown in FIG. 3(c) are generated in a timed sequence.

The molecular-beam 3 irradiated at intervals (pulsed) as shown in FIG. 3(a) supplies growth atoms 4 on the surface of substrate 5, and FIG. 4(a) shows atoms disposed in both proper and improper sites on substrate 5.

When ion-beam 13 for surface bombardment is irradiated at intervals (pulsed) as shown in FIG. 3(b), this gives kinetic energy only to the atoms 4 adsorbed on the surface as shown in FIG. 4(b) since the ion-beam 13 begins its pulse as that molecular beam 3 ends. Ion-beam 13 does not cross with supply molecular beam 3. Since the diffusivity of surface 4 atoms is enhanced as extra kinetic energy is imparted to the surface atoms by the ion-bombardment, the surface diffusion of these atoms is accelerated and they are rearranged on more proper sites.

Figure 4C:
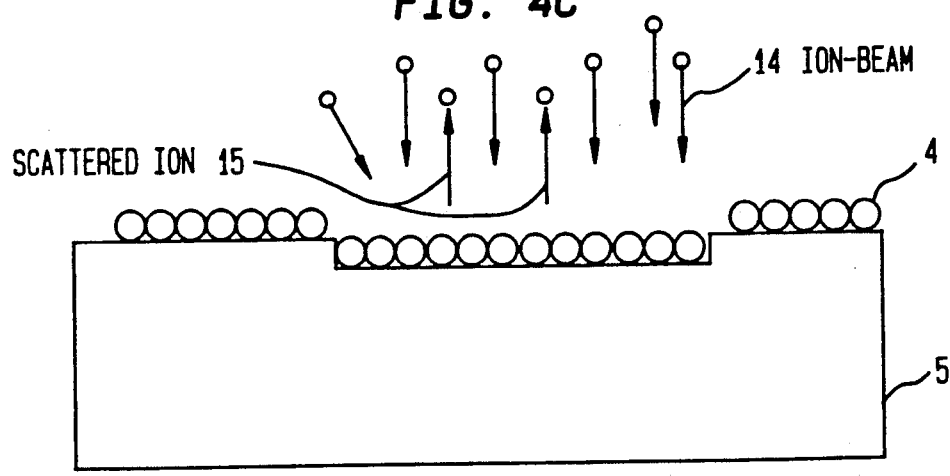

Furthermore, as shown in FIG. 3(c) and FIG. 4(c), analysis and evaluation of the surface structure are conducted by analyzing the ions 15 scattered by irradiation of ion-beam 14 for surface structure analysis. If the surface structure is found inadequate, the result is fed back to either the supply molecular beam 3 or the ion-beam 13 for surface atom bombardment in order to increase the supply of atoms or to enhance surface diffusion of surface atoms.

By repeating these processes, epitaxial growth of which flatness is controlled at an exactness of a single atomic layer can be realized.

A more concrete example of epitaxial growth is shown in the following.

First, an InP (indium phosphorus) substrate kept at 400° C. is cleaned by irradiation with an arsenic molecular beam produced by an MBE apparatus.

Then, a molecular-beam of arsenic (As) and indium (In) (from k-cells set at 900° C. and 300° C. respectively) and a molecular beam of aluminum (Al) (from a K-cell set at 1000° C.) and arsenic are irradiated alternately for three seconds each with an interval of five seconds molecular beam irradiations.

During this interval of five seconds, the substrate and atoms adhered to it are irradiated with helium (He) ions having an incident energy of 1 KeV in order to diffuse InAs and AlAs supplied to the surface evenly. By doing this, each layer of InAs and AlAs can be grown evenly, one molecular layer at a time, forming a super lattice consisting of InAS/AlAs on the InP substrate.

Figure 5:
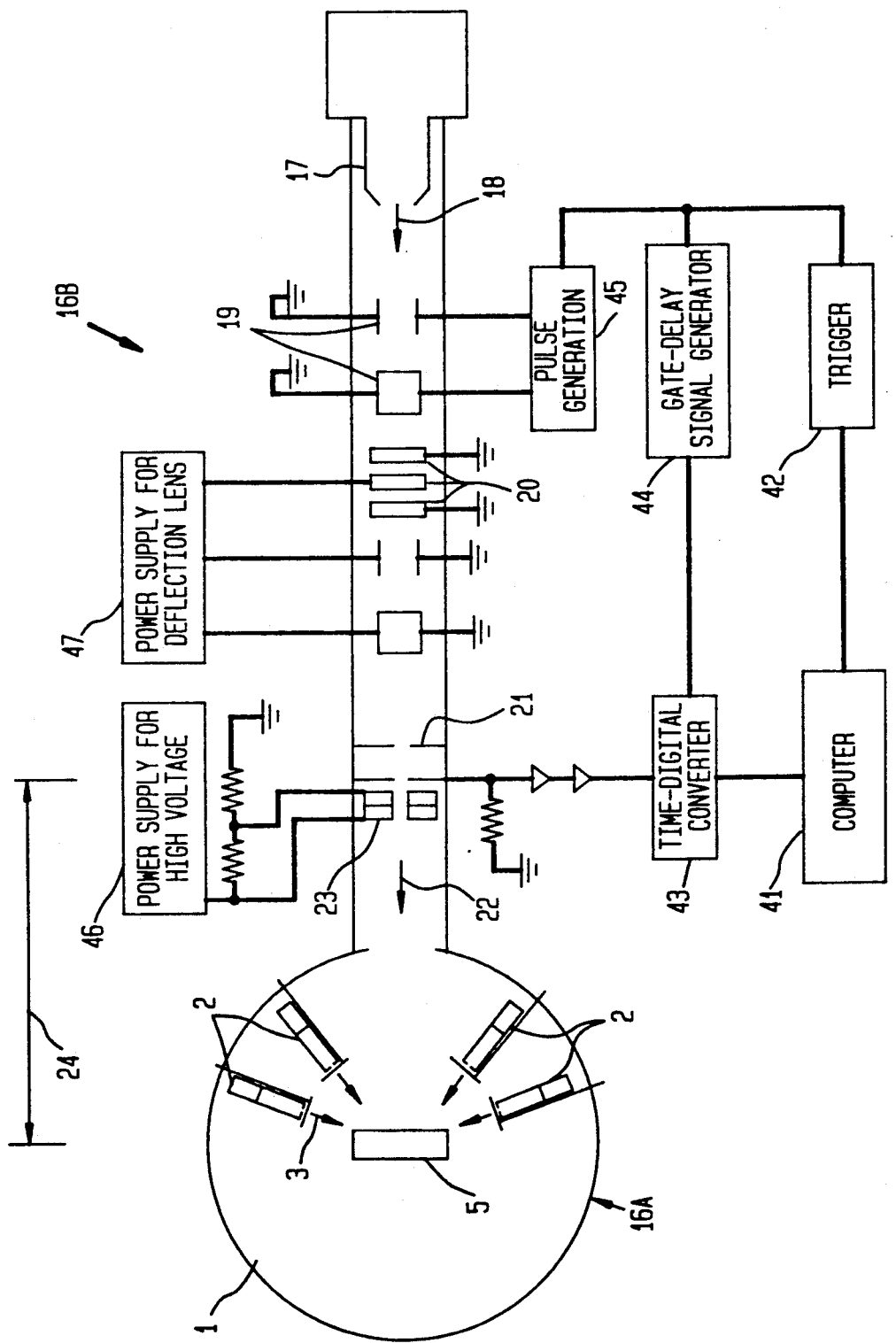
FIG. 5 shows a schematic diagram of equipments employed for said molecular-beam epitaxial growth.

FIG. 5 shows an overall structure of MBE apparatus 16A suitable to carry out the method of the present invention. In this apparatus, ion supply sources for surface bombardment and surface structure analysis are incorporated. The ion supply source is a low energy ion scattering (hereinafter LEIS) device 16B.

The MBE apparatus 16A is equipped with K-cells 2 and a substrate 5 housed in an ultra-high vacuum vessel 1. The elements required for crystal growth are supplied by molecular-beams 3 onto substrate 5.

The condition under which crystal growth is made, is determined by the type of elements forming the growth, and among these, the temperature of each K-cell 2 has to be determined by considering the vapor pressure and the amount of each element required for the crystal growth, and the substrate temperature.

In this example, the ion-source is utilized both for LEIS for surface structure evaluation and for surface bombardment of adhered atoms. When He ions are employed as the ions for surface structure evaluation (and for the surface bombardment also), the helium atoms are ionized in an helium ion-source 17 and are irradiated as an ion-beam 18 which goes through gaps between two pairs of deflection plates 19 for adjusting the direction of said ion-beam. Ion beam is also passed through static lens 20 for focusing.

The DC voltages applied to each of deflection plates 19 and static lens 20 are adjusted, depending on the accelerating energy and other factors, to optimize ion-beam 18. Ion-beam 18 is then further scanned on the slit 21 by means of the deflection plates 19 on which pulse voltage is applied, and therefore, this ion-beam 18 is transformed into a pulsive ion-beam 22 as it goes through the slit 21.

Pulsive ion-beam 22 also goes through a hole provided on detector 23 and then collides on the surface of substrate 5. The ions of beam 22 are then scattered at velocities determined by the type of element with which they have collided, mainly by the mass thereof. The ions of beam 22 are thus turned into scattered ions.

Among those scattered ions, only the ions scattered at an angle of 180 degrees, or those scattered directly backward arrive at detector 23. Since the ion-beam is in a form of pulse, those ions having different velocities traverse a predetermined distance at different flight times. Therefore, the analysis of scattered ions can be accomplished by measuring the flight time required for ions to traverse the distance between the slit 22 and the detector 23. That is detected by the time when the succeeding pulse comes.

In FIG. 5, furthermore, 41 is a computer, 42 is a trigger, 43 is a time-digital converter, 44 is a gate-delay signal generator, 45 is a pulse generator, 46 is a high-voltage source, and 47 is a power supply for static lens 20 and deflection plates 19.

Figure 6:
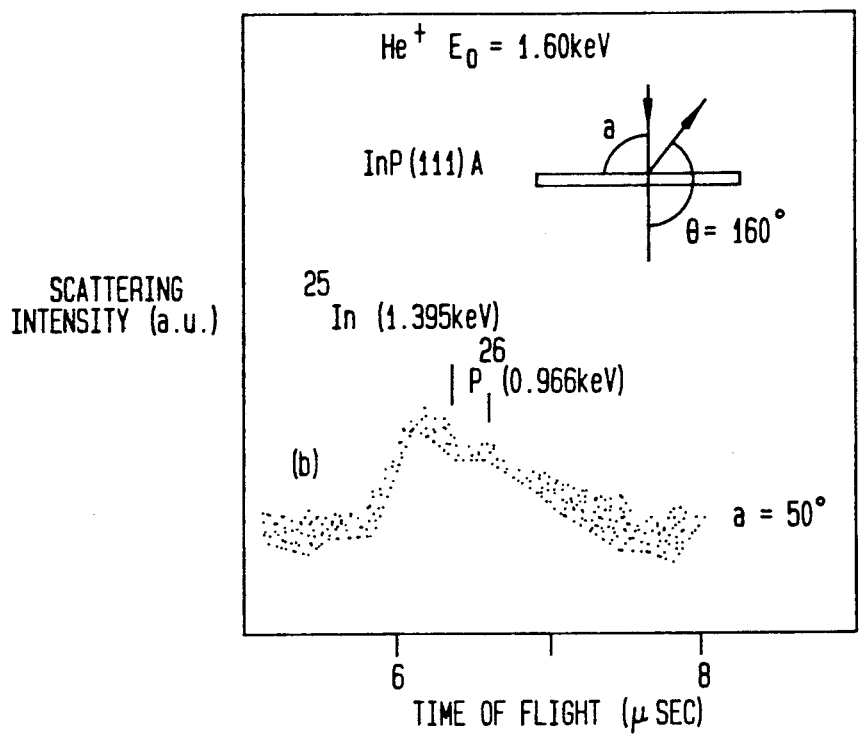
FIG. 6 shows an evaluation result.

FIG. 6 shows a typical LEIS spectrum obtained with an InP substrate surface. This was measured at an accelerating voltage of 1.6 KeV by using the method previously explained.

The kinetic energies of ions scattered during flight time are plotted on the horizontal axis while the numbers of ions scattered are plotted on the vertical axis. Those two observed peaks 25 and 26 correspond to ions scattered by the collisions on indium atoms and phosphorus atoms respectively.

By conducting such measurements during the MBE growth process, taking as an example the case of InP, the type of growth atoms existing on the surface of the substrate can be determined by the time-difference between the scattered ions, and the quantities of these can be simultaneously determined in terms of the intensity. By measuring the incident-angle distribution as the substrate angle is altered, the observation of surface structure can be executed.

Figure 7:
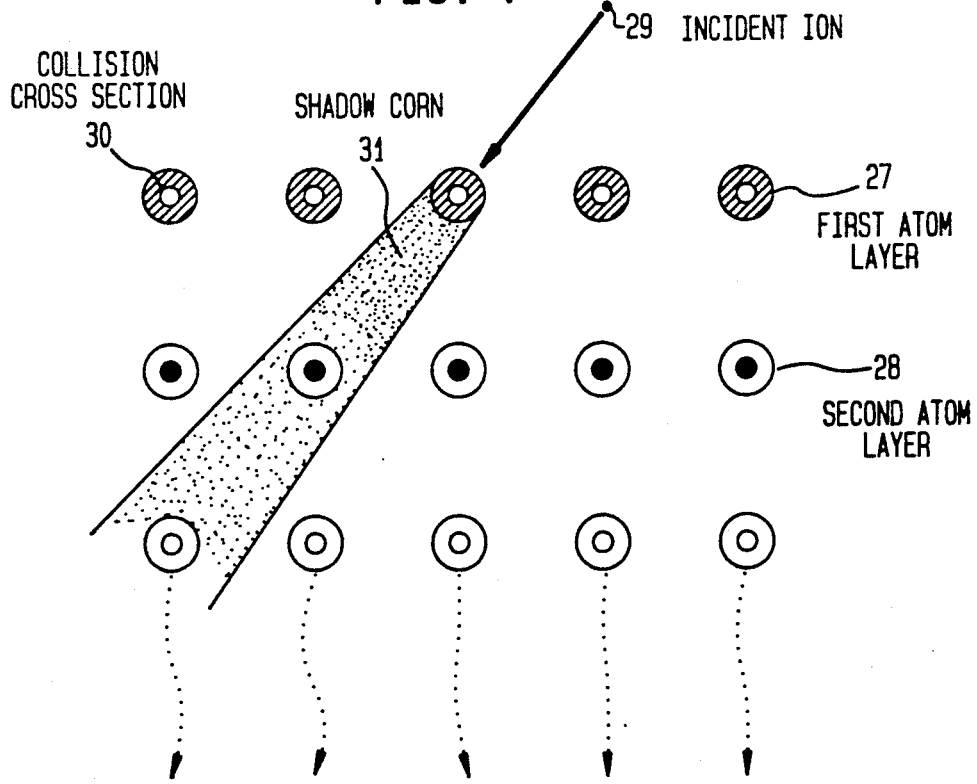
FIG. 7 shows a principle of this evaluation method.
Figure 8:
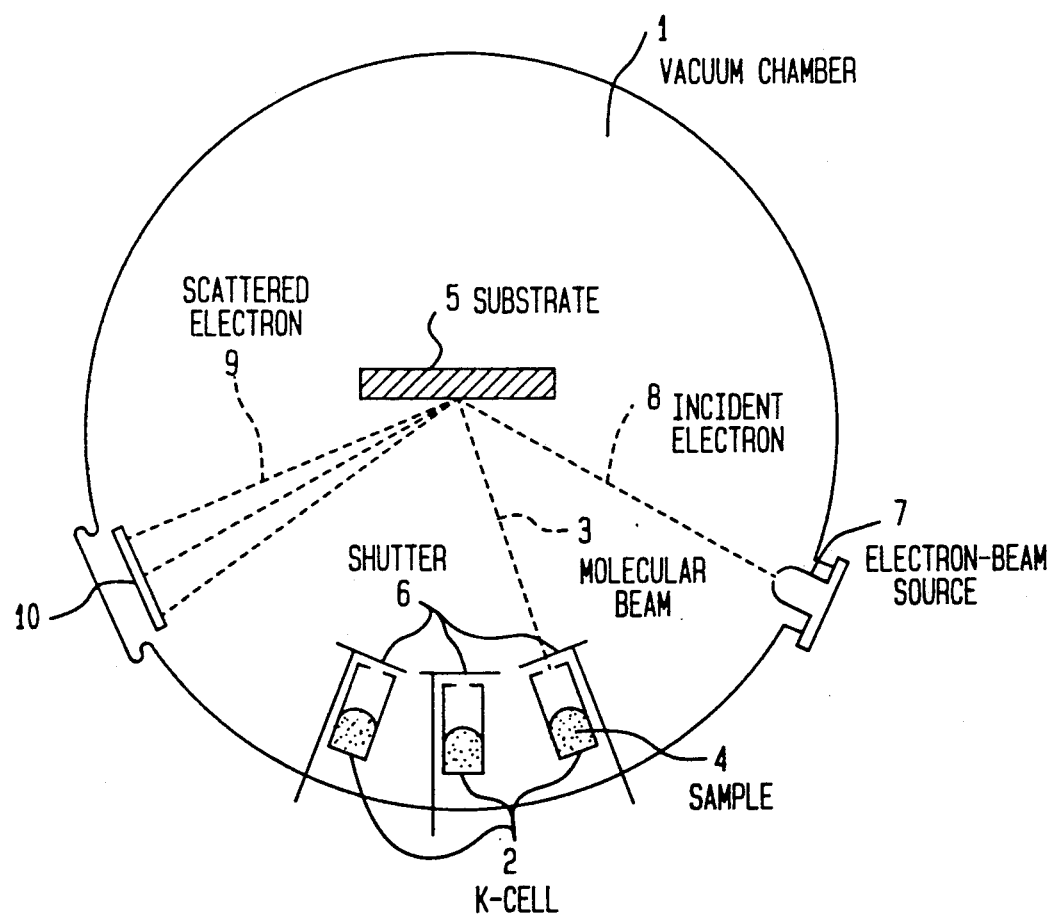
FIGS. 8 and 9a to d illustrate conventional methods.
Figure 9B:
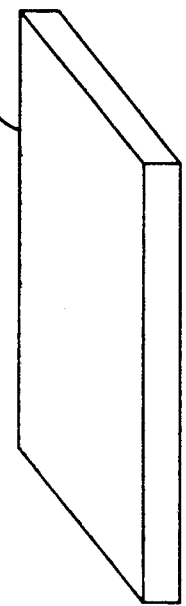
Figure 9C:
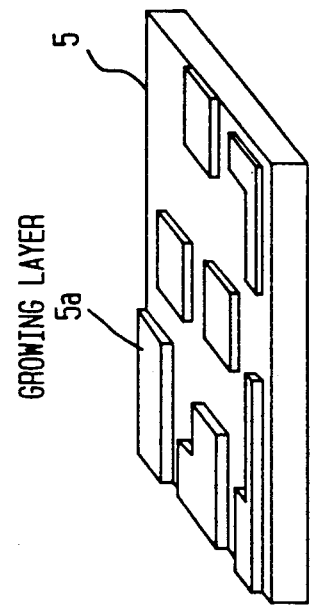
Figure 9D:
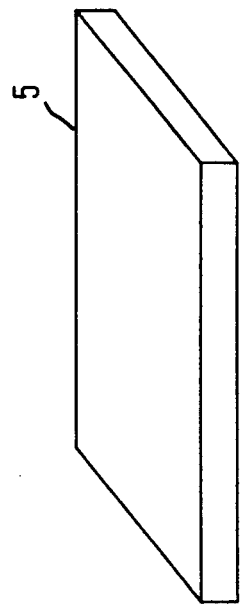
Figure 9A:
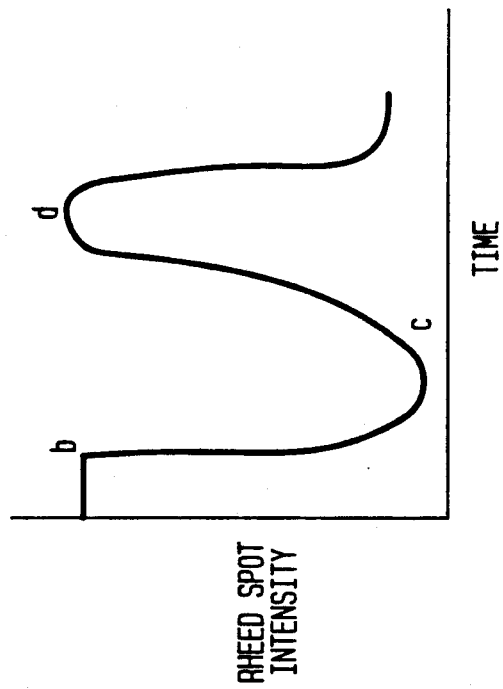

As shown in FIG. 7, due to a finite scattering cross-section 30 to the incident ion 29 either at a first atomic layer 27, a second atomic layer 28, or an atomic layer below those constituting a part neighboring to the substrate surface, a shadow 31 produced by said first atomic layer may extend over the second atomic layer.

Therefore, depending on the incident angle, the atomic layers below the second atomic layer 28 may not be observed as peaks on the LEIS spectrum shown in FIG. 6; the peak instead corresponding only to the first atomic layer.

As mentioned above, by changing the substrate angle and by measuring the dependency of LEIS spectrum on the incident angle, the structure of constituting atomic layers from the surface to a depth of several atomic layers can be determined. Furthermore, together with the peak intensity of the before-mentioned scattered ions, the coverage of surface by the constituting atoms 4 can be determined.

When said pulsive ion-beam described above is used for ion bombardment, this has to be synchronized with either the ion-beam for surface structure evaluation or the pulsed molecular beam for epitaxial growth. However, when it is used only for ion-bombardment, it is operated without applying deflection voltage on the deflection plates. As for the incident angle, it is deflected by turning the substrate 5 or by rotating the ion-beam line.

By employing apparatus as thus constructed, the epitaxial growth is improved by utilizing ion-bombardment to accelerate surface diffusion of atoms 4 adhered to the surface of substrate 5, and the crystal growth is well controlled. In this way, a surface flatness at an exactness of a single atomic layer can be obtained.

Since this method is quite different from the conventional methods to attain surface flatness by means of heat or light-irradiation, problems such as damage of substrate, contamination by impurities, deterioration of equipment, intake of impurity atoms, generation of crystal defects, etc., can be avoided. And furthermore, epitaxial growth is controlled to realize an exactness of a single atomic layer by giving a directionality to the kinetic energy of the adsorbed atoms.

What is claimed:

1. A method of molecular-beam epitaxial growth utilizing ion-beam molecular-beam bombardment, including step (a) ion-beam irradiation of the surface of a substrate on which said growth is formed to evaluate the type of atoms existing on said surface and the surface structure of said substrate at an exactness of a single atomic layer, step (b) ion-beam irradiation of an epitaxial growth made by atoms adsorbed on said surface of said substrate to cause said atoms to have a higher diffusion coefficient at said surface of said substrate on account of kinetic energy given by said ion-beam irradiation, the source of said ion-beam irradiation in step (b) being the same or different than the source of said ion-beam irradiation in step (a), step (c) irradiating a molecular-beam in a pulse mode at a selected time interval to cause epitaxial growth, step (d) causing the irradiation by ion-beam surface atom bombardment of step (b) to be in a pulse-mode synchronous with said pulse-mode molecular-beam, and step (e), causing the step (b) to occur in a vacant period between the pulses of said pulse-mode molecular-beam irradiation of step (c) or between the pulses of said pulse-mode ion-beam irradiation of step (d), and periodically repeating at least step (c) and step (d).

2. A method of molecular-beam epitaxial growth conducted in ultra-high vacuum utilizing ion-beam bombardments, comprising step (a) conducting epitaxial growth by a molecular-beam containing atoms of single or plural types to be grown on a substrate wherein the diffusion velocity of aid atoms adsorbed on a surface of said substrate during said epitaxial growth is accelerated by endowing a kinetic energy to said atoms adsorbed by said molecular-beam by irradiating said substrate by an ion-beam comprising atoms of low atomic mass, step (b) irradiating said substrate with a low energy ion-beam, said low energy ion beam comprising a plurality of primary ions derived from low atomic-mass atoms, said low atomic mass atoms being the same or different from said atoms used for said molecular-beam for surface adsorption, wherein said irradiating is performed for surface structure analysis in order to analyze the energies of said primary ions scattered from said surface of said substrate for evaluating the types and the surface structure of said adsorbed atoms grown on said substrate in a unit of a single atoms layer.

* * * * *

UNITED STATES PATENT AND TRADEMARK OFFICE
CERTIFICATE OF CORRECTION

PATENT NO.    : 5,120,393
DATED         : June 9, 1992
INVENTOR(S)   : Minoru Kubo et al.

It is certified that error appears in the above-identified patent and that said Letters Patent is hereby corrected as shown below:

column 8, line 65, "aid" should be --said--.

column 10, line 6, "atoms" should be --atomic--.

Signed and Sealed this

Eighteenth Day of October, 1994

Attest:

BRUCE LEHMAN

*Attesting Officer*     *Commissioner of Patents and Trademarks*